(12) United States Patent
Fukuda et al.

(10) Patent No.: US 8,026,481 B2
(45) Date of Patent: Sep. 27, 2011

(54) CHARGED PARTICLE APPARATUS, SCANNING ELECTRON MICROSCOPE, AND SAMPLE INSPECTION METHOD

(75) Inventors: Muneyuki Fukuda, Kokubunji (JP); Tomoyasu Shojo, Hachioji (JP); Atsuko Fukada, Kokubunji (JP); Noritsugu Takahashi, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 177 days.

(21) Appl. No.: 11/700,838

(22) Filed: Feb. 1, 2007

(65) Prior Publication Data

US 2007/0181807 A1  Aug. 9, 2007

(30) Foreign Application Priority Data

Feb. 6, 2006  (JP) .................................. 2006-028720

(51) Int. Cl.
*G01N 23/00* (2006.01)
*G21K 7/00* (2006.01)
*A61N 5/00* (2006.01)

(52) U.S. Cl. ........................ 250/306; 250/310
(58) Field of Classification Search .............. 250/310, 250/311, 306, 307, 492.2; 700/32, 83, 110
See application file for complete search history.

(56) References Cited

U.S. PATENT DOCUMENTS

| | | | | |
|---|---|---|---|---|
| 5,546,516 A | * | 8/1996 | Austel et al. ................ | 345/440 |
| 5,818,415 A | * | 10/1998 | Shirakawa .................. | 345/442 |
| 5,894,311 A | * | 4/1999 | Jackson ...................... | 345/440 |
| 6,289,257 B1 | * | 9/2001 | Sekine ........................ | 700/121 |
| 6,307,573 B1 | * | 10/2001 | Barros ........................ | 715/764 |
| 6,308,187 B1 | * | 10/2001 | DeStefano .................. | 715/234 |
| 6,583,634 B1 | | 6/2003 | Nozoe et al. | |
| 6,927,771 B2 | * | 8/2005 | Ikami ......................... | 345/440 |
| 6,933,499 B2 | * | 8/2005 | Furukawa et al. ........... | 250/310 |
| 6,937,254 B2 | * | 8/2005 | Nishiyama et al. ......... | 345/619 |
| 7,205,555 B2 | * | 4/2007 | Okuda et al. ............... | 250/492.2 |
| 7,348,980 B2 | * | 3/2008 | Mazzagatti et al. ......... | 345/440 |
| 7,570,797 B1 | * | 8/2009 | Wang et al. ................. | 702/83 |
| 2005/0145955 A1 | * | 7/2005 | King .......................... | 257/405 |
| 2005/0194535 A1 | * | 9/2005 | Noji et al. .................. | 250/311 |
| 2005/0221514 A1 | * | 10/2005 | Pasadyn et al. ............ | 702/108 |
| 2005/0230618 A1 | * | 10/2005 | Onishi et al. ............... | 250/310 |
| 2005/0247876 A1 | * | 11/2005 | Kawada et al. ............ | 250/310 |
| 2006/0102839 A1 | * | 5/2006 | Bhaskar et al. ............ | 250/310 |

FOREIGN PATENT DOCUMENTS

| | | |
|---|---|---|
| JP | 2000-314710 | 11/2000 |
| JP | 2000-314710 A1 | 11/2000 |
| JP | 2005-191017 | 7/2005 |

* cited by examiner

*Primary Examiner* — Robert Kim
*Assistant Examiner* — Brooke Purinton
(74) *Attorney, Agent, or Firm* — Mattingly & Malur, PC

(57) ABSTRACT

An object of the invention is to be able to select easily and quickly inspection recipes which are appropriate to samples from any number of inspection recipes. A calculating device displays a plurality of inspection recipes on the GUI. An inspection recipe includes settings for controlling charged particle columns which irradiate charged particles on samples with a plurality of characteristics. Plural inspection recipes are arranged and displayed on a coordinate system which is specified by a plurality of axes having characteristic values (robustness variable of charge up, throughput of defect inspection, and accuracy of defect inspection) which have mutually trade-off relationships.

7 Claims, 11 Drawing Sheets

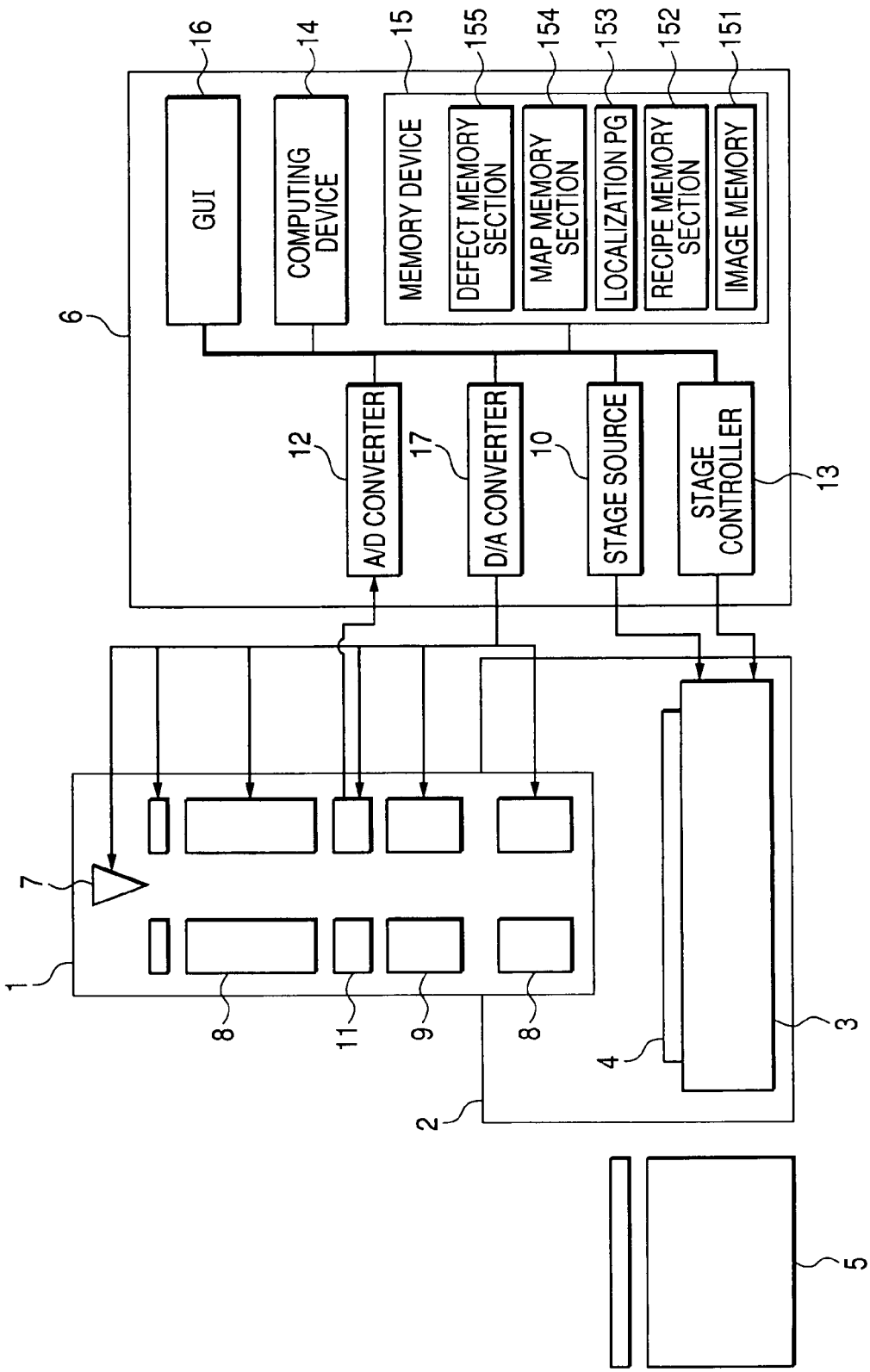

FIG. 2

| CONTROL CONDITION OF PRE-IRRADIATION DOSE ~51 | OBSERVATION CONDITIONS ~71 | CHARACTERISTICS OF DEFECT LOCALIZATIONS ~91 |
|---|---|---|
| IRRADIATION VOLTAGE: **** ~52<br>BEAM CURRENT: **** ~53<br><br>ASTIGMATISM SETTING: **** ~55<br>LENS SETTING: **** ~56<br>BURSTING VOLTAGE: **** ~57<br>BEAM ALIGNMENT: **** ~58<br><br>FIELD OF VIEW: **** ~59<br>SCANNING PATTERN: **** ~60<br>LOOP TIME: **** ~61<br>DWELL TIME: **** ~62<br>FRAME INTEGRATE: **** ~63<br><br>BRIGHTNESS: **** ~64<br>CONTRAST: **** ~65 | IRRADIATION VOLTAGE: **** ~72<br>BEAM CURRENT: **** ~73<br><br>ASTIGMATISM SETTING: **** ~75<br>LENS SETTING: **** ~76<br>BURSTING VOLTAGE: **** ~77<br>BEAM ALIGNMENT: **** ~78<br><br>FIELD OF VIEW: **** ~79<br>SCANNING PATTERN: **** ~80<br>LOOP TIME: **** ~81<br>DWELL TIME: **** ~82<br>FRAME INTEGRATE: **** ~83<br><br>BRIGHTNESS: **** ~84<br>CONTRAST: **** ~85 | THROUGHPUT OF DEFECT LOCALIZATIONS: **** ~92<br>ACCURACY OF DEFECT LOCALIZATIONS: **** ~93<br>ROBUSTNESS VARIABLE OF CHARGE UP: **** ~94<br>MINIMUM LIMIT OF FAILURE DETECTION: **** ~95 |

FIG. 12

| CONTROL CONDITION OF PRE-IRRADIATION DOSE (51) | OBSERVATION CONDITIONS (71) | CHARACTERISTICS OF DEFECT LOCALIZATIONS (91) |
|---|---|---|
| IRRADIATION VOLTAGE: **** ~52<br>BEAM CURRENT: **** ~53<br><br>ASTIGMATISM SETTING: **** ~55<br>LENS SETTING: **** ~56<br>BURSTING VOLTAGE: **** ~57<br>BEAM ALIGNMENT: **** ~58<br><br>FIELD OF VIEW: **** ~59<br>SCANNING PATTERN: **** ~60<br>LOOP TIME: **** ~61<br>DWELL TIME: **** ~62<br>FRAME INTEGRATE: **** ~63<br><br>BRIGHTNESS: **** ~64<br>CONTRAST: **** ~65 | IRRADIATION VOLTAGE: **** ~72<br>BEAM CURRENT: **** ~73<br><br>ASTIGMATISM SETTING: **** ~75<br>LENS SETTING: **** ~76<br>BURSTING VOLTAGE: **** ~77<br>BEAM ALIGNMENT: **** ~78<br><br>FIELD OF VIEW: **** ~79<br>SCANNING PATTERN: **** ~80<br>LOOP TIME: **** ~81<br>DWELL TIME: **** ~82<br>FRAME INTEGRATE: **** ~83<br><br>BRIGHTNESS: **** ~84<br>CONTRAST: **** ~85 | THROUGHPUT OF DEFECT LOCALIZATIONS: **** ~92<br>ACCURACY OF DEFECT LOCALIZATIONS: **** ~93<br>ROBUSTNESS VARIABLE OF CHARGE UP: **** ~94<br>MINIMUM LIMIT OF FAILURE DETECTION: **** ~95<br><br>SAMPLE NAME: ********* ~96<br>PROCESS NAME: ********* ~97<br>CHEMICAL FORMULA: ********* ~98<br>DIELECTRIC CONSTANT: **** ~99<br>FILM THICKNESS: **** ~100<br>CHARGE TENDENCY: ****** ~101 |

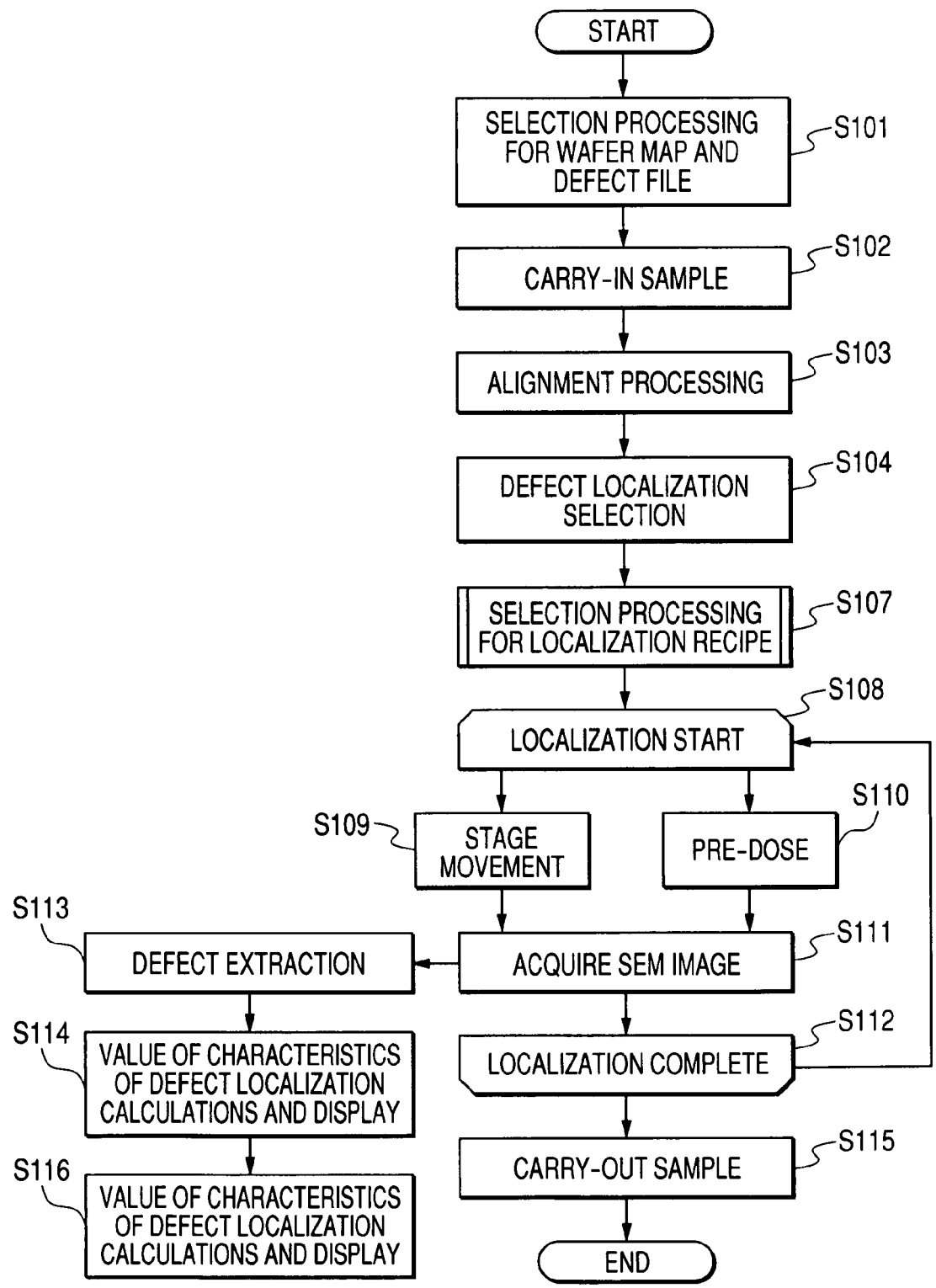

CHARGED PARTICLE APPARATUS, SCANNING ELECTRON MICROSCOPE, AND SAMPLE INSPECTION METHOD

CLAIM OF PRIORITY

The present application claims priority from Japanese application JP 2006-028720 filed on Feb. 6, 2006, the content of which is hereby incorporated by reference into this application.

FIELD OF THE INVENTION

This invention relates to a charged particle apparatus and a scanning electron microscope, and especially to technology which supports the selection of inspection recipes for the charged particle apparatus and scanning electron microscope.

BACKGROUND OF THE INVENTION

Conventionally, in order to localize the defects for fine structure formation such as with LSI (Large Scale Integration), various inspection systems are used. For example, optical inspection systems form optical images of minute circuits with the object of inspecting this image in order to detect abnormalities. However, with optical images there is insufficient resolution to specify the minute feature characteristics, and because of that limitation, it is difficult to distinguish damaging defects and non-damaging defects at sites of circuit formation. On the other hand, inspection systems which use charged particle beams have sufficient resolution to make an image of the minute feature characteristics such as contact holes, gates, and interconnections and the feature characteristics for minute defects. In addition, it is possible to utilize classification detection for the magnitude of the defects based on shadow image of the defect's form. Consequently, when the charged particle beam system is used for inspection of minute circuits that have been manufactured in a process which uses a minimum critical dimension of 90 nm or less, there is merit in measurement when compared to an optical inspection system.

There is a charged particle beam system which effectively detects the defect by strengthening the shadow image of the defect through adjustment of the azimuth and elevation angle. However, when inspecting for a resist film after coating and image development with a LSI formation process or insulating film, charges are generated by charged particles irradiation for image formation, and with the change in orbit of the secondary electrons, there are generated bright spots (shading) on the observations. When strengthening the shadow image in order to improve the defect detection sensitivity, there is an increased effect on the observations as a brightness change from the secondary electrons, and shading is furthermore easily generated. Consequently, in order to effectively detect defects, it is very important to setup a charged particle beam system so as to eliminate shading, increase inspection sensitivity and inspection throughput.

Generally, in a charged particle beam system, it is possible to control the charge amount by adjusting the settings of optical conditions such as the beam current, landing voltage, booster voltage, image magnification, scanning pattern, scan speed and number of retrieving frame of images. In addition, there is charge control technology for pre-irradiation doses, for neutralization, UV brightness, $H_2O$ gas, flat gun, probe shunting and the like. With a charged particle beam system, there is combined the setting for these optical conditions and charge control technology and control of the charges is better than with conventional means. However, through the details of combining the optical condition settings and the charge control technology (called inspection recipe), there are great changes in defect detection efficiency (accuracy of defect inspection and throughput of defect inspection) with a charged particle beam system. Robustness variable of charge up (capacity showing the ease of charging and the throughput of defect inspection) depends on the sample. Because of this dependency, the most appropriate inspection recipe differs for every sample. There are many settings for an inspection recipe, and because of this number, it is necessary to have a high degree of knowledge when forming the inspection recipe.

Japanese laid-open Patent 2000-314710 registers in database inspection recipes which correspond to the sample name, sample construction or the inspection recipe name. Also, the patent discloses a technology which searches for the most appropriate inspection recipe for the sample from the database. According to this technology, because it is possible to extract the most appropriate inspection recipe for the sample from the sample name and the like, an operator can obtain a high degree of knowledge for forming the inspection recipe.

In addition, in Japanese laid-open Patent 2005-191017, technology is disclosed which determines and displays the charge from observations of the sample. According to this technology, the operator can see the charge conditions of the sample, and it is possible to determine whether or not the inspection recipe is appropriate by this visualization ability.

SUMMARY OF THE INVENTION

As was stated above, according to the technology contained in Japanese laid-open Patent 2000-314710, because it is possible to search for the most appropriate inspection recipe for a sample according to the sample's name, it is not necessary to have a high level knowledge in order to build up an inspection recipe by the operator. However, it is not possible to search for an inspection recipe that is appropriate for a sample which is not registered in the database.

In addition, according to the technology contained in Japanese laid-open Patent 2005-191017, it is possible to determine whether or not an inspection recipe is appropriate-visualizing the charge conditions of the sample by the operator. However, this technology is directed to determine the charge, and is not directed to select the most appropriate recipe for the sample.

This invention, in keeping with the information, has as its goal to be able to quickly and easily select an appropriate recipe for a sample from any of a plurality of inspection recipes.

In order to solve the problem, this invention displays a plurality of control parameters (inspection recipes). The control parameters include settings for controlling the charged particle column which irradiates the charged particle beam on the sample and a plurality of characteristic values. Each of plural control parameters is displayed by arrangement on a coordinate system, which is specified by a plurality of axes having a characteristic value (robustness variable of charge up, throughput of defect inspection, and accuracy of defect inspection) that is designated, for example, by an operator.

According to an embodiment of this invention, plural control parameters is displayed by arrangement on a coordinate system which has, for axes, the characteristic values such as robustness variable of charge up, throughput of defect inspection, and accuracy of defect inspection. Because these characteristic values have relationship trade-offs, the operator can easily and quickly select the inspection recipe that is appropriate for the sample from among plural control parameters that are arranged on the coordinate system.

BRIEF DESCRIPTION OF THE DRAWINGS

FIG. 1 is an outline diagram of the charged particle apparatus which is appropriate for use with one embodiment of this invention;

FIG. 2 shows a typical inspection recipe;

FIG. 12 shows a modification of the inspection recipes;

FIG. 14 explains a modification of the operation flow of the charged particle apparatus shown in FIG. 5.

DETAILED DESCRIPTION OF THE PREFERRED EMBODIMENTS

Figure 3:
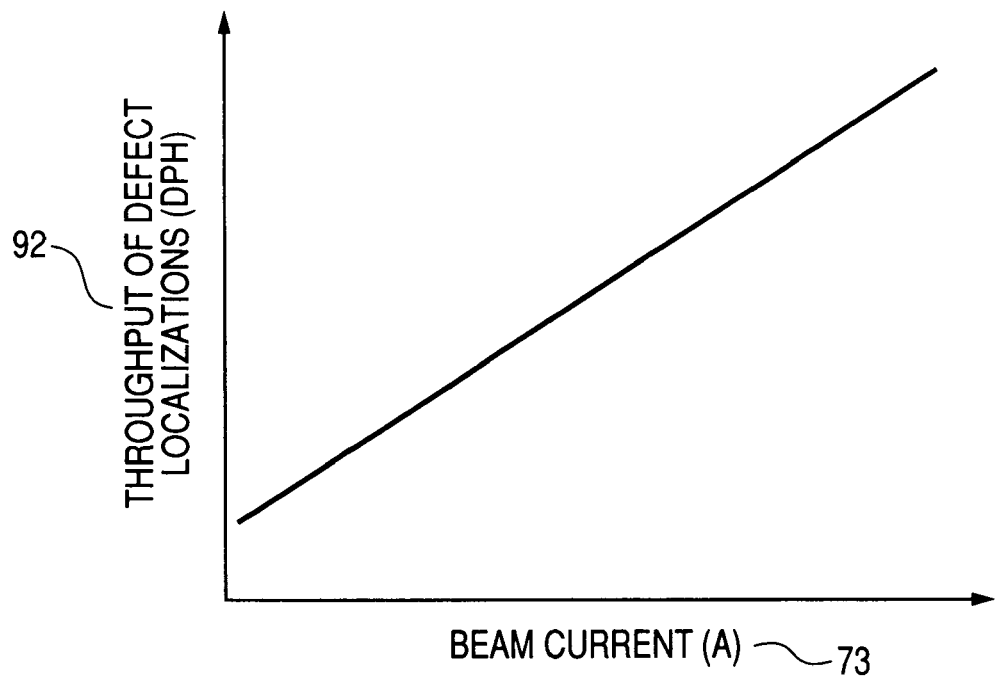
FIG. 3 shows typical dependencies with respect to the beam current 73 of the throughput of defect inspection 92.

Below, there is an explanation of one embodiment of this invention.

FIG. 1 is an outline view of the charged particle apparatus which is used for one embodiment of this invention.

As shown in the FIG., the charged particle beam of this embodiment provides an electronic optical system 1 which irradiates an electron beam on the sample 4, a sample chamber 2, a stage 3 which is placed in the sample chamber 2, a carry structure which carries the sample 4 to the stage 3 of the sample chamber 2, and a control device 6.

The electron optical system 1 has an electron gun 7 which generates an electron beam, a focusing lens 8 which focuses the electron beam, a deflection lens 9 which deflects the electron beam, and a detector 11 which detects the electrons that are secondarily emitted from the sample 4. The electron gun 7 and the deflection lens 9 form the SEM column, and the focusing lens 8 forms an image optical system.

The control device 6 has a stage electrical source 10 which irradiates the sample 4 of stage 3 by reducing the speed of the electron beam, with an A/D converter which A/D converts the detected signal which is output from the detector 11, a stage controller 13 which controls the coordinates of the stage 3, a calculating device 14, a memory device 15, a GUI (Graphical User Interface) 16, and a D/A converter 17, which D/A converts the control signal of the electron optical system which is output from the calculating device 14.

The memory device 14 has an image memory section 151, a recipe memory section 152, a map memory 153, a defect memory section 154, and an inspection program 155.

Image data from observations which were obtained by scanning the charged electron beam on the sample 4 are stored in the image memory section 151. The inspection recipes that determine the acquisition conditions for observations according to the electron charged beam device are stored as pluralities in the recipe image section 152, corresponding to recipe IDs for identifying inspection recipes. Inspection recipes are discussed later. Wafer map data for plural samples 4 which are used for inspection are stored in the map memory section 153 corresponding to the sample IDs which identify the samples 4. Moreover, this embodiment uses semiconductor wafers for samples 4. Defect file data which shows defect sites for plural samples 4 which is used for inspection are stored in the defect memory section 154 corresponding to the sample IDs.

The inspection program 154 is a program for inspection of a sample 4. The calculating device 15, following the inspection program 154, along with selection by the operator of the wafer data and the defect file for the inspection subject sample 4 from the map memory section 153 and the defect memory section 154, selects the inspection recipe which is used in the inspection of sample 4 from the recipe memory 152. There is output of a control signal to every section of the charged particle apparatus through the D/A converter 17 so as to scan the charged particle beam under observation conditions which were shown on the sample which was specified by the selected wafer map data and in the inspection recipe. There is acquisition by the A/D converter 12 of the detected signal from the detector 11, observation (SEM image) formation by image analysis processing, and storage in the image memory section 154. In addition, there is detection of defects by pattern matching on these observations, calculation of the detected defect, and calculation of the characteristic information for inspection by comparison with the defect site which the selected defect file data showed and display on the GUI 16 of these results.

FIG. 2 shows a typical recipe. As shown in the FIG., the inspection recipe has a control condition for pre-irradiation dose 51, an observation condition 71, and characteristics of defect inspection 91.

The control condition for pre-irradiation dose 51 is a setting for determining the irradiation amount and irradiation time for the charged particle beam for pre-charging the sample 14 before acquiring the observation. The control condition for pre-irradiation dose 51 incorporates, for example, the landing potential 52 for setting the potential of the electron gun 7 and stage 3, the beam current 53, the astigmatism setting 55 for setting the focus lens 8, the lens setting 56, the booster voltage 57, the beam alignment 58 for setting the deflection lens 9, the field of view 59 for setting the beam scanning method, the scanning pattern 60, the loop time 61, the beam dwell time 62, the frame integrate 63, the brightness 64 for setting the detector 11, and the contrast 65.

This embodiment executes the pre-irradiation dose by using an electron optical system 1. However, the pre-irradiation dose may also be accomplished with other electron optical systems. In addition, it is possible to refine the items of the control condition of pre-irradiation dose 51 by combining with pre-irradiation implemented methods. Moreover, when the pre-irradiation dose is not necessary, there does not have to be separate establishment of the control condition of pre-irradiation dose 51. In addition, the control condition of the pre-irradiation dose 51 may be replaced by settings from charge control technology which control the charge of the neutralizer, UV irradiation, H₂O gas, flat gun, and probe shunt and the like.

The observation condition 71 is a setting for determining the irradiation amount and time for the charged electron beam 5 which scans in order to acquire an observation of the sample 4. The observation condition 71 incorporates, for example, the landing potential 72 for setting the potential of the electron gun 7 and stage 3, the beam current 73, the astigmatism setting 75 for establishing the focus lens 8, the lens setting 76, the booster voltage 77, the beam alignment 78 for setting the deflection lens 9, the field of view 79 for setting the beam scanning method, the scanning pattern 80, the loop time 81, the beam dwell time 82, the frame integrate 83, and the brightness 84 and contrast 85 for setting the detector 11.

The characteristics of defect inspection 91 are characteristics for inspection corresponding to the observations, based on the control condition for pre-irradiation dose 51 and the observation condition 71. The characteristics of defect inspection 91 incorporate, for example, the throughput of defect inspection 92 and the accuracy of defect inspection 93 of defects which are included in the observation, the robustness variable of charge up 94 of the sample and the minimum limit of failure detection 95.

FIG. 3 is a diagram which is a typical example of the dependency with respect to the beam current 73 of the throughput of defect inspection. By the charged particle apparatus, there are successive observations of the sample 4 during a short period, and the speed at which there is inspection of the defect from the observation is the throughput of defect inspection. As shown in the diagram, when changing only the beam current 73, the throughput of defect inspection 92 increases together with the beam current 73. The larger the value of defect inspection 92 (for example, 2000-3000 defects/time (DPH)), the more effective the inspection recipe is said to be.

Figure 4:
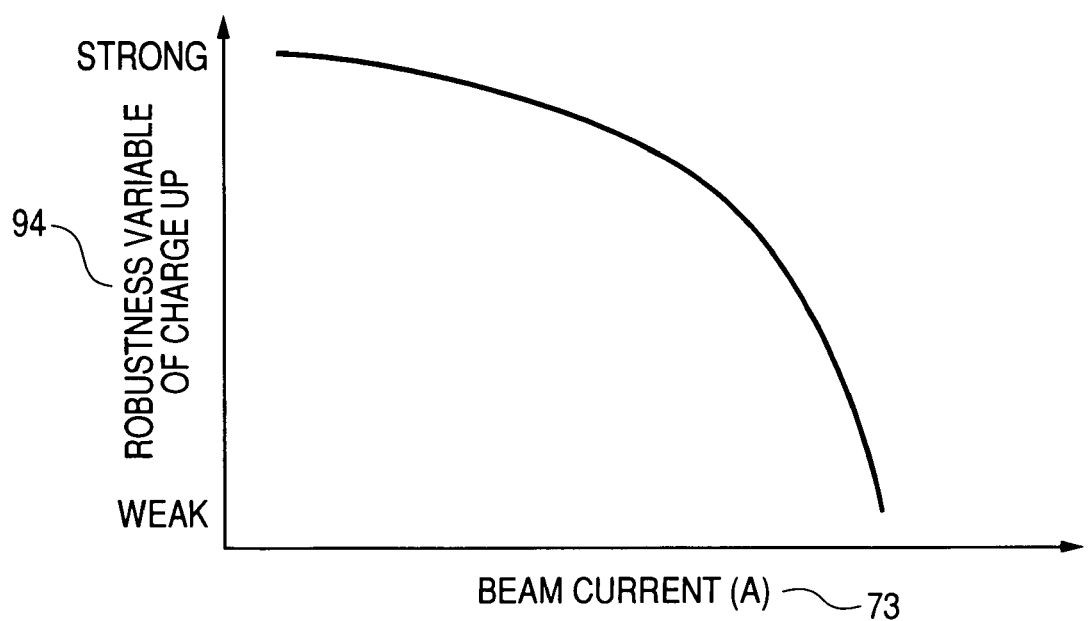
FIG. 4 shows typical dependencies for a beam current 73 for the robustness variable of charge up.

FIG. 4 shows the typical dependency with respect to the beam current 73 of the robustness variable of charge up 94. The robustness variable of charge up 94 is an index for the degradation of the observation which is generated by charges from the sample. For example, it is possible to use shading which appears on the observation as the robustness variable of charge up. By controlling the shading generation, it is possible to successively determine an effective inspection. As shown in the FIG., when increasing only the beam current 73, the robustness variable of charge up decreases, with shading easy to generate. The charge on the sample 4 increases through the increase in the beam current 73, because shading easily occurs when the observation is acquired. The stronger the robustness variable of charge up 94, the more effective the inspection recipe is said to be. Moreover, the robustness variable of charge up 94 may be quantified by combining cases where there are problems in generating an observation, for example, when the quantifying the extent of control of shading occurrence.

As is understood from FIGS. 3 and 4, when increasing the beam current 73 of the observation condition 71, on the one hand, it is possible to speed up the throughput of defect inspection 92, though the robustness variable of charge up 94 becomes weak, and shading is easily generated. That is, the throughput of defect inspection 92 and the robustness of variable charge up 94 have a trade-off relationship. This trade-off relationship is established in the same way as with the beam current 53 of the control condition of the control condition of pre-irradiation dose 51. Because of this trade-off relationship, it is not possible to select the most appropriate inspection recipe by referencing only one of the construction elements of the characteristics of defect inspection 91. By simultaneously referencing plural elements of the characteristics of defect inspection 91, it is possible to select the most appropriate inspection recipe. Here, in this embodiment, by the operator referencing simultaneously the throughput of defect inspection 92 and the robustness variable of charge up 94 for each inspection recipe which is stored in the recipe memory section 152, there can be selection of the most appropriate inspection recipe by the operator.

Figure 5:
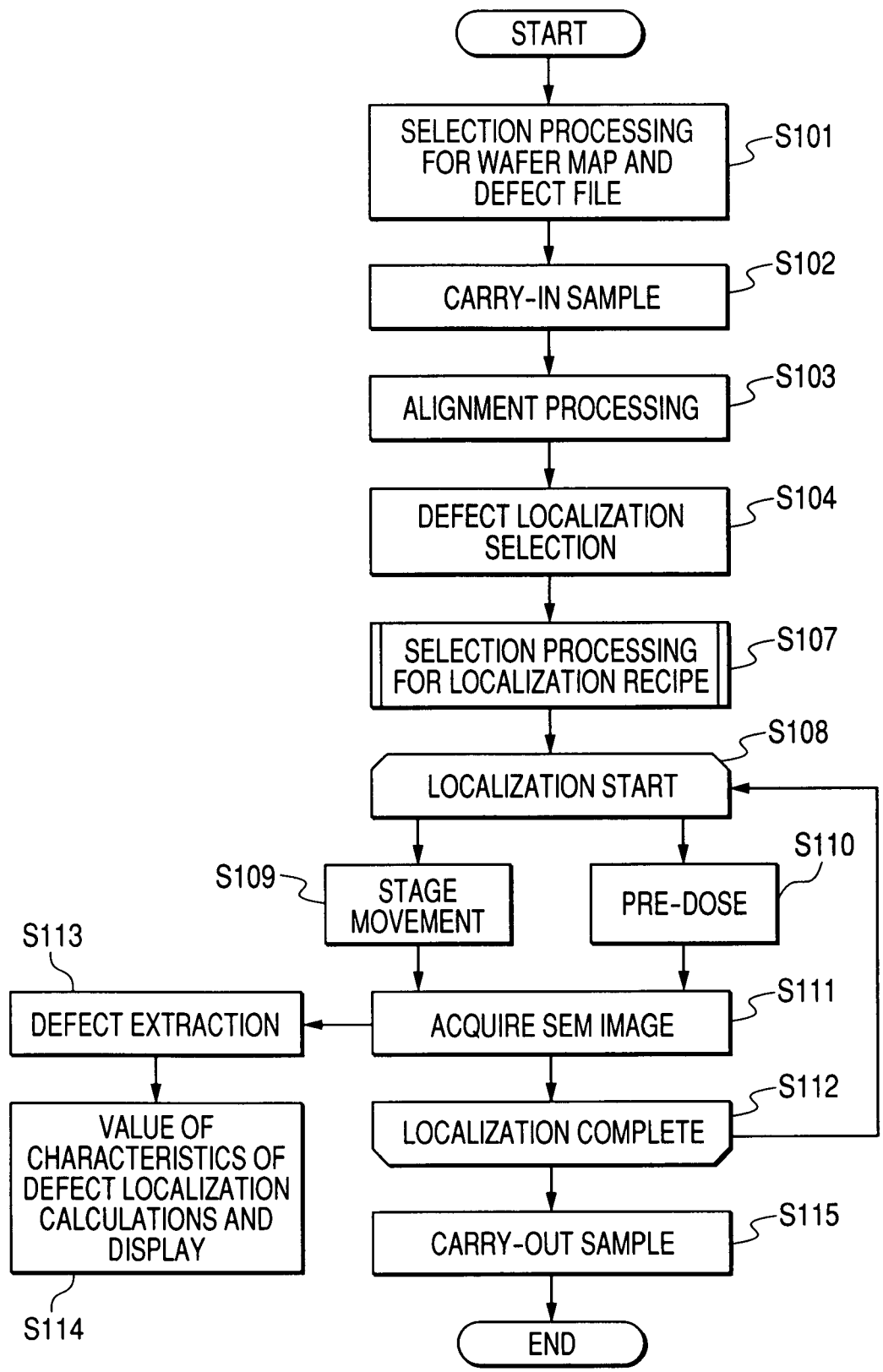
FIG. 5 explains the operation flow of the charged particle apparatus which is appropriate for use with one embodiment of this invention.

FIG. 5 explains the operation flow of the charged particle apparatus which is appropriate for one embodiment of this invention. This operation flow has the calculating device 14 implemented by executing the inspection program 153.

First, the calculating device displays on the GUI 16 the sample ID of each sample 4 whose data was respectively stored in the map memory section 154 and the defect memory section 155, with the operator selecting the sample ID of the inspection object. There is setup of the wafer map and the defect file, which is stored in the map memory section 154 and the defect memory section 155, corresponding to the selected sample ID, as the wafer map and defect file of the inspection object (S101).

Next, the calculating device 14 has an indicator of the alignment on the GUI 16 that the operator has effected by conveying to the sample chamber 2 the inspection object through operation of the conveyer 5, with placement on stage 3 which was placed within the sample chamber 2 (S102).

Next, the calculating device 14, following the operational details, which were received from the operator from the GUI 16, adjusts the position of the stage 3 through the stage controller 13. From this adjustment, there is alignment of the inspection object which was placed on stage 3 and the electron optical system 1 (S103).

Next, the calculating device 14 displays, on the GUI 16, plural defect sites of the inspection object which are specified by the defect file for the inspection object, and the operator selects at least one defect site of the inspection object (S104). From this selection, the calculating device 14 carries out the later described inspection recipe, selecting the inspection recipe which is used for inspection of the inspection object. (S105).

Furthermore, the calculating device 14, having completed the wafer map of the inspection object, selection processing of the defect file, alignment processing, selection processing of the defect sites, and selection processing of the inspection recipes, proceeds if input from the operator through the GUI 16 is indicated, and inspection of the inspection object begins (S108).

First, the calculating device 14, by outputting the control signal to every section of the electron optical system 1 through the D/A converter 17, along with irradiating a charged particle beam which adhered to the control condition of pre-irradiation dose 51 of the inspection recipe for the inspection object which was placed at the electron optical system on stage 3 (S110), moves stage 3 by the stage controller 13 according to the wafer map and defect file (S109). With this movement, the sample is charged by scanning a charged particle beam on the area which includes the defect sites of the sample 4 for the inspection object.

Next, the calculating device 14, by outputting the control signal to every part of the optical system 1 through the D/A converter 17, along with irradiating the charged particle beam according to the electron optical system 1, the inspection object which was placed on stage 3, and the observation condition 71 of the inspection recipe, moves stage 3 by the stage controller 13 according to the wafer map and the defect file. With this movement, there is scanning of the charged particle beam on an area which includes the defect sites of the inspection object. The detector 11 detects the secondary electrons of the inspection object. The calculating device 14 acquires this detection signal through the A/D converter 12, generates observation (SEM image) data by executing image analysis processing and stores the data in the image memory section 151 (S111).

Next, the calculating device 14 receives an indication from the operator from the GUI 16 of whether or not to continue inspection. If the indicator is for continued inspection, inspection is continued by returning to S108. On the other hand, if inspection is completed, after calculation and display (S114) of the later described inspection characteristics, the calculating device waits for further indications from the operator.

After completing inspection of the sample 4 of the inspection object, the operator conveys from the sample chamber 2 the sample of the inspection object by operating the conveyer structure 5 (S115).

In addition, the calculating device 14, with the observations stored in the image memory section 151, and using the inspection object pattern which was pre-registered in, for example, the memory device 15, performs pattern matching for this observation, and detects the defect from the observation (S113). Next, there is calculation of the characteristics of defect inspection by using the inspection results of this defect, with display on the GUI 16 (S114). In this embodiment, there is output, as characteristics of defect inspection, the throughput of defect inspection and accuracy of defect inspection. Here, the throughput of defect inspection is a count of the defect inspection per unit time by inspection, with calculation by dividing the count of the defects inspected by S113 from the time from inspection start (S108) to inspection completion (S112). In addition, the accuracy of defect inspection is a value which shows the rate (probability) of defects that can be actually detected by S113 among the defects of the inspection object which were selected by S104.

Moreover, in the flow, the selection processing (S101) and convey processing of the sample 4 (S102) may be exchanged orderwise. In addition, it is possible to exchange in the same way, for the sample 4, the alignment processing (S103), the selection processing of the defect inspection (S104), and the selection process (S107) of the inspection recipe.

In addition, when the pre-irradiation dose is not necessary, the stage movement (S109) and pre-irradiation processing (S110) may be omitted. In addition, in place of the stage movement (S109) and the pre-irradiation processing (S110), there may be used charge control technology which controls the charge of the neutralizer, UV irradiation, H$_2$O gas, flat gun, and probe shunt and the like.

Figure 6:
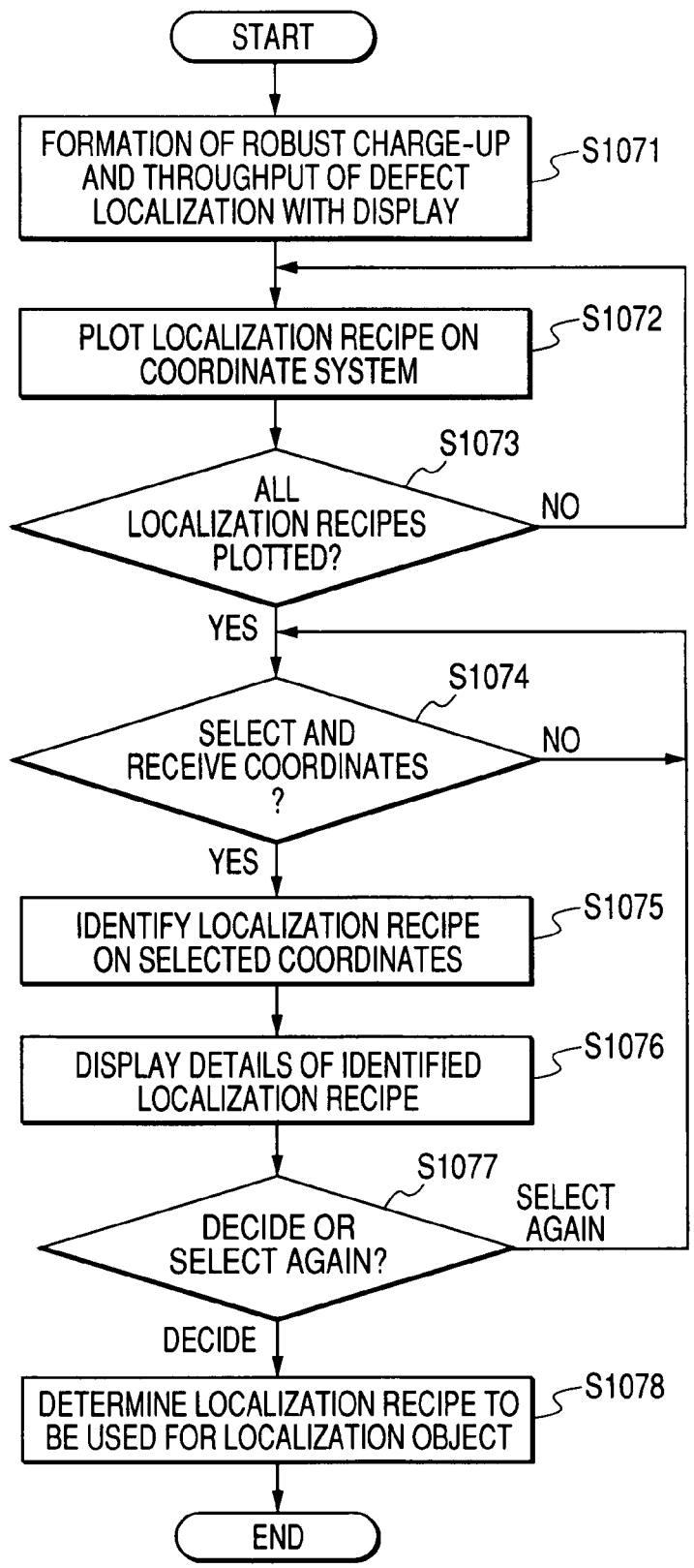
FIG. 6 explains the selection processing (S107) for inspection recipes shown in FIG. 5.

FIG. 6 explains the selection process (S107) of the inspection recipe which is shown in FIG. 5.

First, the calculating device 14 generates a 2-D coordinate system with the throughput of defect inspection as the vertical axis, displaying this system on the GUI 16 (S1701). Next, the calculating device 14 reads one inspection recipe from the recipe memory section 152 and plots the recipe ID of this inspection recipe on the 2-D coordinate system which is displayed on GUI 16 the coordinates that are determined by the robustness variable of charge up 94 and the throughput of defect inspection 92 for this inspection recipe (S1702).

Next, the calculating device 14 determines whether or not the recipe IDs of all of the inspection recipes which are stored in the recipe memory 152 are plotted on the 2-D coordinate system which is displayed on GUI 16 (S1703). If there are inspection recipes that are not plotted (NO, by S1703), there is a return to S1702 and the inspection recipes are plotted. On the other hand, when all the inspection recipes have been plotted (YES, by S1703), the calculating device 14 has the selected coordinates on the 2-D coordinate system from the operator through the GUI 16 (S1704).

Furthermore, the calculating device 14., if the coordinates on the 2-D coordinate system have been selected by the operator through the GUI 16 (YES, by S1704), indicates the recipe ID which is displayed at the selected coordinates (S1705). There are displayed in separate windows on the GUI 16 details of the inspection recipes which have the specified recipe IDs (details of the control condition of pre-irradiation dose 51, observation conditions 71 and characteristics of defect inspection 91) (S1706).

Next, the calculating device 14, through the GUI 16, receives indication of either to determine the inspection recipe which is to be used for the inspection objects among the inspection recipes which are displayed in detail on GUI 16 or to reselect another inspection recipe (S1707). When there is an indication to reselect another inspection recipe, return to S1704. On the other hand, when receiving an indication to determine the inspection recipe for use with the inspection object, the device determines that this inspection recipe is the one to use for the inspection object (S1708).

Moreover, in S1701, a 2-D coordinate system, displayed on the GUI 16, is generated with the throughput of defect inspection as the horizontal axis and the robustness variable of charge up as the vertical axis.

Figure 7:
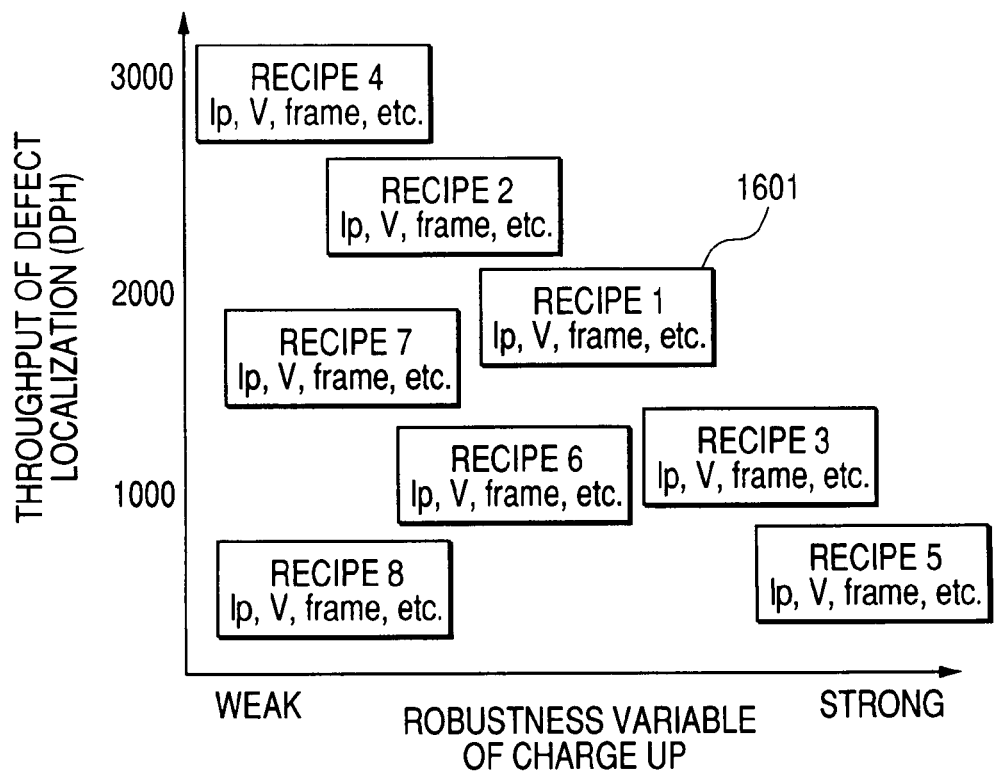
FIG. 7 shows one example of a selection screen for inspection recipes which is formed by the flow shown in FIG. 6.

FIG. 7 shows one example of the selection screen of the inspection recipes that is formed by the flow shown in FIG. 6. In this example, the horizontal axis is the robustness variable of charge up and the vertical axis is the throughput of defect inspection. According to the diagram, the recipe ID 1601 for each inspection recipe is plotted at coordinates which are specified by the robustness variable of charge up 94 and the throughput of defect inspection 92 of the inspection recipe which has this recipe ID. When the operator selects the desired recipe ID 1601 by operating the cursor, not illustrated, details of the inspection recipe, which has the selected recipe ID 1601, are displayed in a separate window or the like. It is possible for the operator to easily grasp the inspection recipe which is close to the throughput of defect inspection and the robustness variable of charge up that correspond to the inspection needs from each recipe ID 1601, which is displayed on this robustness variable of charge up-throughput of defect inspection coordinate system.

Figure 8:
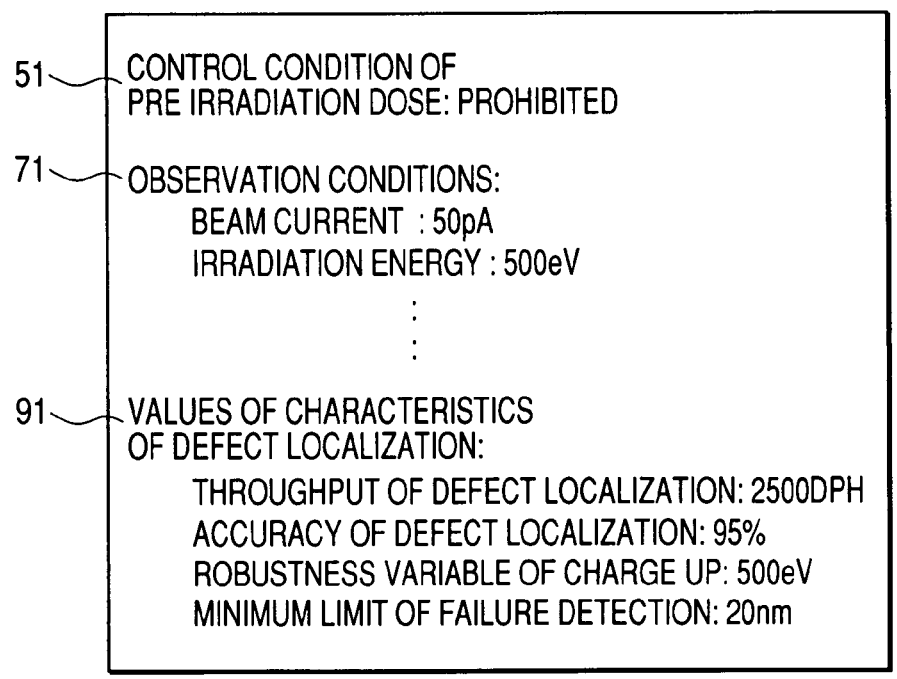
FIG. 8 shows one example of the details for inspection recipes which is displayed by FIG. 6's S1076.

FIG. 8 shows one example of the details of the inspection recipe which is displayed using S1706 of FIG. 6. As shown in the FIG., there is displayed the control condition of pre-irradiation dose 51, the observation condition 71, and the characteristics of defect inspection 91 which are included in the inspection recipe. Because the operator can reference detailed information about the inspection recipe when selecting the inspection recipe, it is possible to more effectively select the inspection recipe. Moreover, the values of every item which forms the inspection recipe (settings and characteristics) may be displayed showing numerical ranges.

This was an explanation of one embodiment of this invention.

Moreover, this invention is not limited to the embodiment, and several possible variations are possible within the scope of the invention.

For example, in this embodiment, when selecting the inspection recipe (FIG. 5's S107), it is possible to determine the image quality of the observation. For example, for each respective inspection recipe, there can be pre-storing of observation data, which is obtained by scanning the charged particle beam on a specific sample 4 using the inspection recipe, in the recipe memory section 152, corresponding to the recipe ID of this inspection recipe. In FIG. 6's S1706, in place of details of the inspection recipe or in addition to details of the inspection recipe, there can be displayed on the GUI 16 observations for this inspection recipe.

Figure 9:
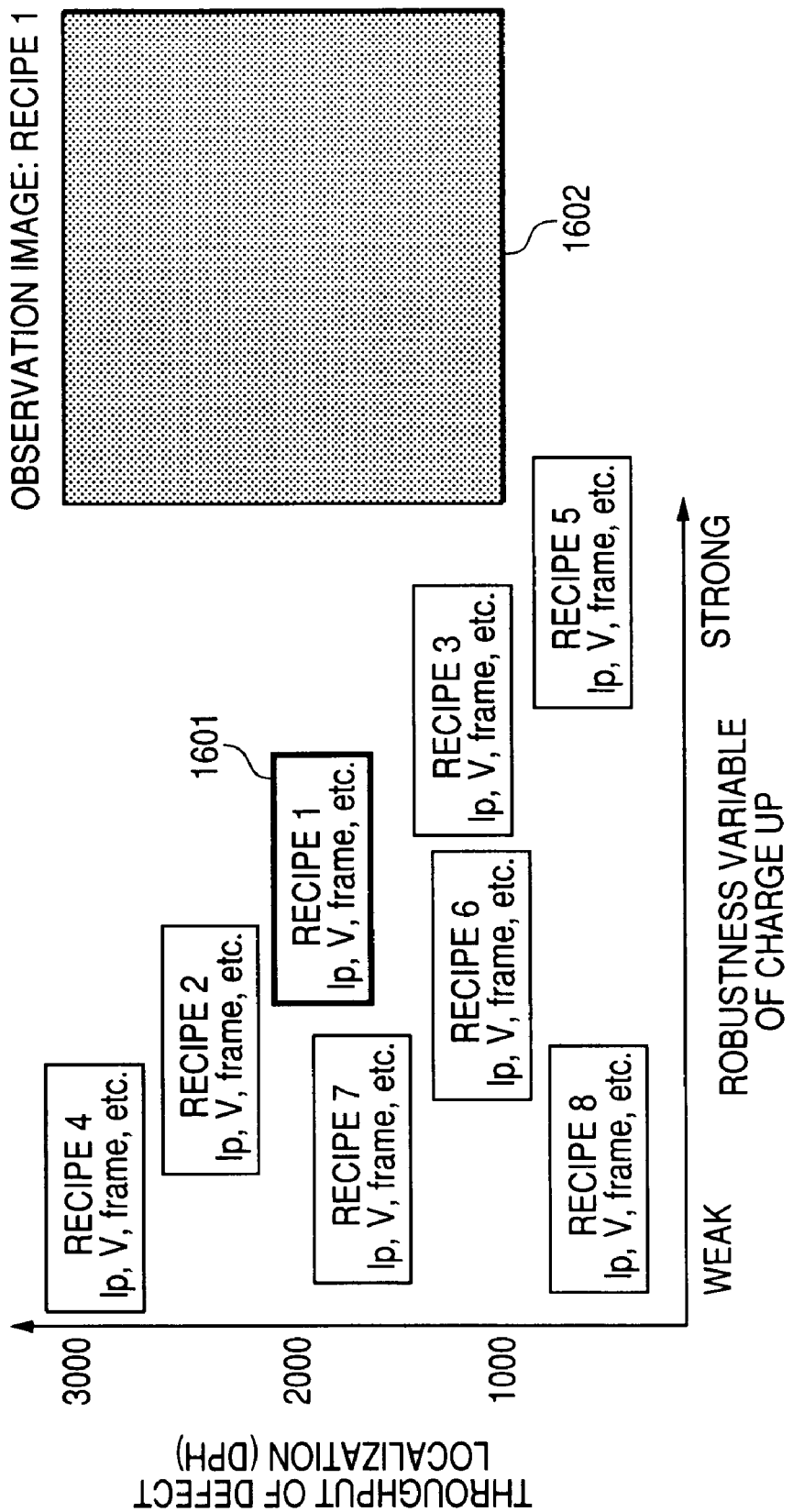
FIG. 9 shows one example of observations which are displayed along with a selection screen for inspection recipes in the flow shown in FIG. 6.

FIG. 9 shows one example of observations that are displayed with the selection screen for the inspection recipe in the flow shown in FIG. 6. In this example, along with an enhanced display of the recipe ID for the extracted recipe which the operator selected on the selection screen for the inspection recipe, which is shown in FIG. 7, observation data 1602 from this inspection recipe is shown in a separate window. The operator can further reduce the probability of selecting inspection recipes that are extremely distant from inspection needs by determining the image quality of the observations according to the extracted inspection recipe. Moreover, in FIG. 6's S1077, there is automatic determination of image quality by using the technology that is contained in the Japanese Patent JP-A No. 2005-191017. When the image quality does not satisfy the requested values as given by the operator, return to S1074, and by proceeding to S1078 when the quality is sufficient, it is possible to select the inspection recipe by using the operator's selected operation.

In addition, in the embodiment, in FIG. 6's S1071, the calculating device 14 forms a 2-D coordinate system with the robustness variable of charge up as the horizontal axis and the throughput of defect inspection as the vertical axis, displaying on GUI 16. In FIG. 6's S1072, there is plotted the recipe ID of the inspection recipe on this robustness variable of charge up-throughput of defect inspection coordinate system. However, this invention is not so limited. There may be formation of a coordinate system with characteristics of defect inspection 91 on the vertical and horizontal axes which represent mutual trade-offs, with plotting of the recipe IDs of the inspection recipes on this coordinate system. Here, for example, in FIG. 6's S1071, there is pre-stored in the memory device 15 a list representing a combination of the characteristics of defect inspection 91 which have mutual trade-offs. These are shown on the GUI 16 and may be selected by the operator. It is not inconvenient to generate a coordinate system using a combination of selected characteristics of defect inspection 91.

Figure 10:
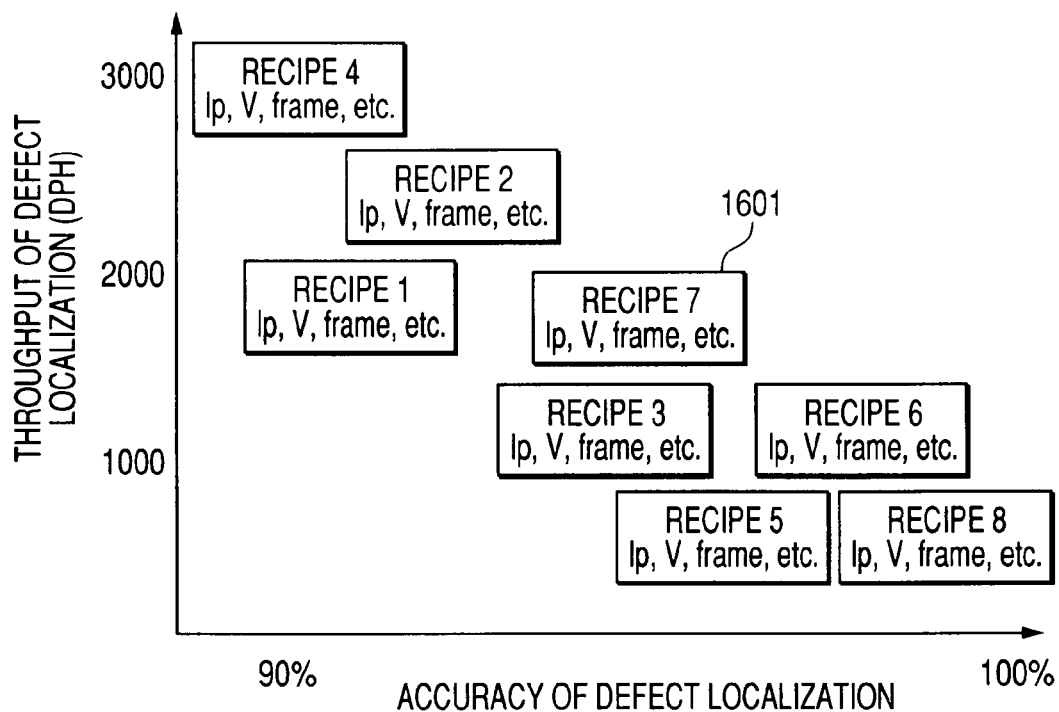
FIG. 10 shows a modification of a selection screen for inspection recipes formed by the flow in FIG. 6.

FIG. 10 shows a variation of the selection screen for inspection recipes that were formed by the flow in FIG. 6. In this example, the horizontal axis represents the accuracy of defect inspection and the vertical axis represents the throughput of defect inspection. As shown in the FIG., the recipe IDs 1601 for each inspection recipe is plotted at coordinates that are specified by the accuracy of defect inspection 93 and the throughput of defect inspection 92 for the inspection recipe which has this recipe ID. The operator can easily grasp the inspection recipe that is close to the throughput of defect inspection and the accuracy of defect inspection which corresponds to the inspection needs from each of the recipe IDs 1601 which is shown on this accuracy of defect inspection-throughput of defect inspection coordinate system.

Figure 11:
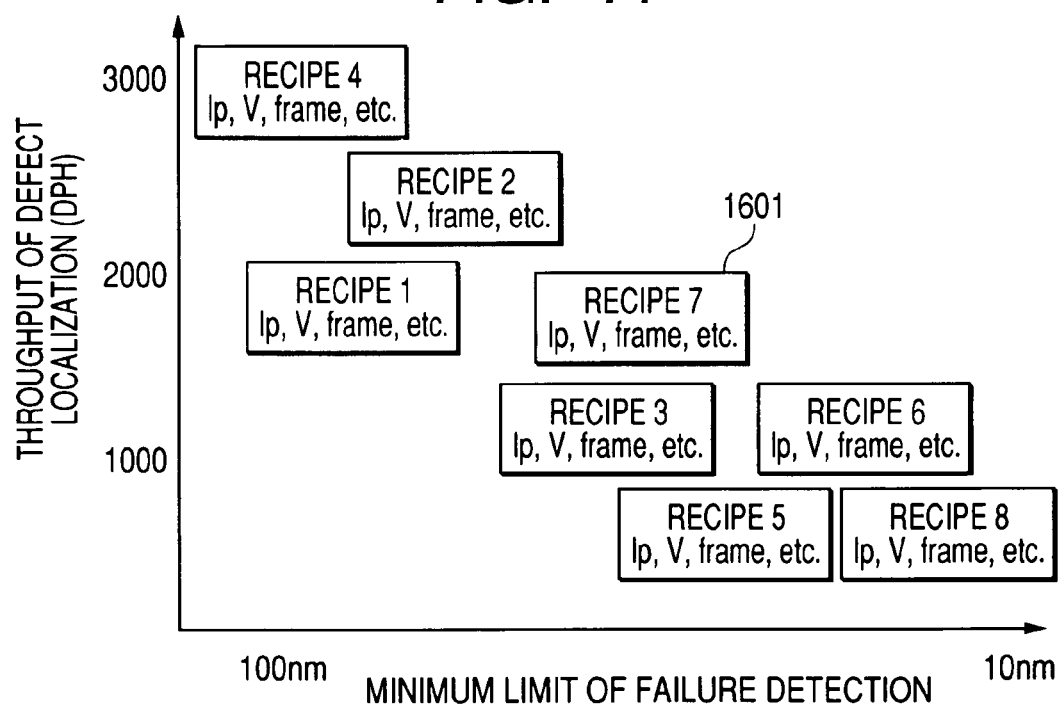
FIG. 11 shows a modification of a selection screen for inspection recipes formed by the flow in FIG. 6.
Figure 13:
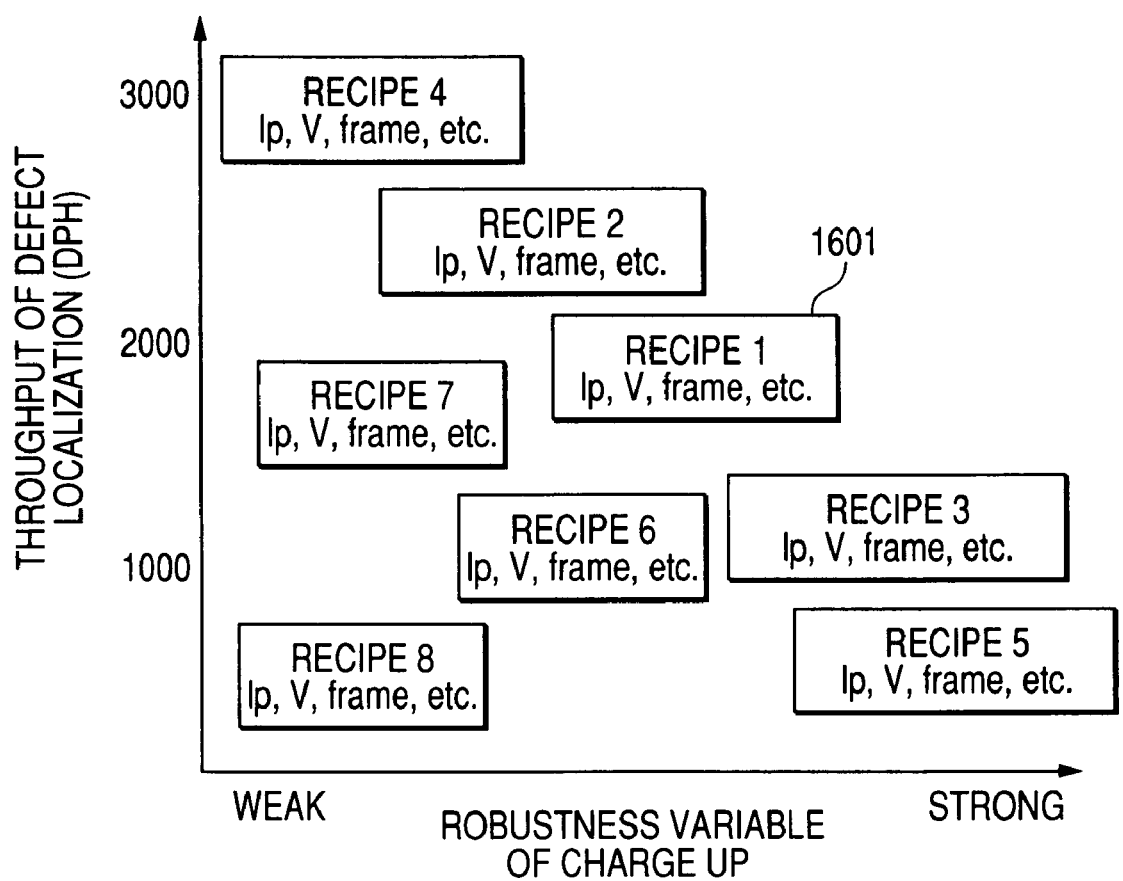
FIG. 13 shows a modification of a selection screen for inspection recipes formed by the flow in FIG. 6.

FIG. 11 shows another variation of the selection screen for inspection recipes which were formed by the flow that is shown in FIG. 6. In this example, the horizontal axis represents the minimum limit of failure detection and the vertical axis, the throughput of defect inspection. As shown in the FIG., the recipe IDs 1601 of each inspection recipe are plotted at coordinates specified by the minimum limit of failure detection and the throughput of defect inspection 92 which are detectable for the inspection recipes which have this recipe ID. The operator can easily grasp the inspection recipes which are close to the detectable minimum limit of failure detection and the throughput of defect inspection which correspond to the inspection needs from each recipe ID 1601 which is shown by this detectable minimum limit of failure detection-throughput of defect inspection coordinate system.

In addition, the settings and characteristics which are contained in the inspection recipes are not limited to those shown in FIG. 2. FIG. 12 shows a variation of the inspection recipe. In the inspection recipe which is shown in this diagram, for the inspection recipe which is shown in FIG. 2, in addition to the screening conditions which relate to characteristics of defect inspection 91 and the practical use of the inspection recipe (throughput of defect inspection 25, accuracy of defect inspection 93, robustness variable of charge up 94 and extractable minimum limit of failure detection 95), there are included screening conditions that are related to the sample (sample name 96, process name 97, chemical formula 98, dielectric constant 99, film thickness 100 and charge tendency 101). In the details of the inspection recipes which are shown in FIG. 8 there are also included and shown'screening conditions which relate to the sample. Because the operator can reference the screening conditions which relate to the sample when selecting the inspection recipe, it is possible to more effectively select the inspection recipe.

In addition, in the embodiment, it is permissible to make the size of the recipe ID 1601 which plots on the coordinate system using S1602 of FIG. 6 large enough to represent the many acceptable inspection recipes. In addition, it is permissible to display the characteristics of defect inspection 91 within a recipe ID 1601 icon. Concretely, include a count of the acceptable number for each inspection recipe that is contained in the recipe memory section 152. In S1072 of FIG. 6, the size of the icon of the recipe ID 1601 is proportional to the count of acceptable inspection recipes which have this recipe ID 1601. There is plotting on the coordinate system by storing the characteristics of defect inspection 91 within this icon. In addition, in S1708 of FIG. 6, the calculating device 14 increments by one the acceptable count of the inspection recipes that is stored in the recipe memory section 152, if the inspection recipe is selected. When done in this way, it is possible to display the inspection recipes as prompts for the operator indicating the accepted count of inspection recipes.

In addition, in the embodiment, it is permissible to reflect the inspection results for the sample 4 in the inspection recipe. FIG. 14 explains variations of the operation flow for the charged particle beam which is shown in FIG. 5. The operation flow S116 which is shown in FIG. 5 is added to the operation flow of this FIG. In S116, the calculating device 14, refreshes the characteristics of defect inspection 91 for the inspection recipe, which was selected by S107 and stored in the recipe memory section 152, to the characteristics of defect inspection 91, which were calculated by S114. In this way, the characteristics of defect inspection for the inspection recipe are refreshed by each inspection, and it is possible to more accurately store the inspection recipes in the recipe memory section 152. In addition, based on the update of the characteristics of defect inspection 91 for the inspection recipe which was selected by S107, it is possible to automatically refresh the characteristics of defect inspection for other inspection recipes by a learning function.

This invention, for devices which have a plurality of setting parameters for which the accurate prediction beforehand of the effect of the setting parameters is not possible, extracts setting parameters from information of well-known effects to be able to appropriately use technology which effectively selects.

What is claimed is:
1. A charged particle apparatus, comprising:
a charged particle beam column which irradiates a charged particle beam on a sample;
a stage which contains the sample;
an electron optical system;
a detector which detects the particles which are generated from the sample by irradiating the sample with the charged particle beam;
a charged particle control means which controls the charged particle beam;
a memory; and a display control means which displays on a monitor control parameters for the charged particle control means which has a plurality of characteristics;

wherein the charged particle control means stores a wafer map and a defect file in the memory;

wherein the charged particle control means aligns the sample on the stage;

wherein the charged particle control means displays and selects defect sites of the sample;

wherein the charged particle control means generates a 2-D coordinate system with a throughput of defect inspection as a vertical axis, and displays the 2-D coordinate system on a GUI;

wherein the charged particle control means reads an inspection recipe from a recipe memory section of the memory and plots a recipe ID of the inspection recipe on the 2-D coordinate system which is displayed on the GUI such that coordinates of the recipe ID are determined by a robustness variable of charge up and the throughput of defect inspection for the inspection recipe;

wherein the charged particle control means determines whether or not recipe IDs of all of the inspection recipes which are stored in the recipe memory are plotted on the 2-D coordinate system which is displayed on the GUI;

wherein the charged particle control means selects the inspection recipes from the 2-D coordinate system;

wherein the charged particle control means irradiates the charged particle beam according to the electron optical system by outputting a control signal to the optical system through a D/A converter, the sample which was placed on the stage, and the observation condition of the inspection recipe, wherein the charged particle control means moves the stage by a stage controller according to the wafer map and the defect file, and the charged particle control means scans the charged particle beam on an area which includes the defect sites of the sample, and the detector detects secondary electrons of the sample; and wherein the charged particle control means acquires a detection signal through the A/D converter, and generates observation data (SEM image data) by executing image analysis processing and stores the observation data in the image memory section of the memory.

2. A charged particle apparatus according to claim 1, wherein the coordinate system is a 2-D coordinate system which is specified by the vertical axis and a horizontal axis.

3. A charged particle apparatus according to claim 1, further comprising:

an image analysis means which forms image data through image analysis processing from the detection signal of the detector; and an inspection means which detects defects by pattern matching processing the image data which was formed by the image analysis means.

4. A charged particle apparatus according to claim 3, wherein the control parameters include settings for the charged particle control means, settings for the image analysis means, and characteristics of defect inspection for the detection means as the plurality of characteristics.

5. A charged particle apparatus according to claim 4, wherein the setting for the charged particle control means are control conditions of pre-irradiation doses, and wherein the settings of the image analysis means are SEM (scanning electron microscope) observation conditions.

6. A scanning electron microscope comprising: a stage for placing a sample;

a scanning electron microscope (SEM) column which scans a primary electron beam on the sample that was placed on a stage;

an electron optical system;

an image optical system having a detector which detects by imaging the electrons which are generated from the sample by the scanning;

an image display system which displays by imaging the signal which is detected by the image optical system;

a SEM column control device which controls the SEM column; and a memory means which stores a plurality of control information for the SEM column control device which has a plurality of characteristics wherein the SEM column control device stores a wafer map and a defect file in the memory means;

wherein the SEM column control device aligns the sample on the stage;

wherein the SEM column control device displays and selects defect sites of the sample;

wherein the SEM column control device generates a 2-D coordinate system with a throughput of defect inspection as a vertical axis, and displays the 2-D coordinate system on a GUI;

wherein the SEM column control device reads an inspection recipe from a recipe memory section of the memory means and plots a recipe ID of the inspection recipe on the 2-D coordinate system which is displayed on the GUI where coordinates of the recipe ID are determined by a robustness variable of charge up and the throughput of defect inspection for the inspection recipe;

wherein the SEM column control device determines whether or not recipe IDs of all of the inspection recipes which are stored in the recipe memory section are plotted on the 2-D coordinate system which is displayed on the GUI;

wherein the SEM column control device selects the inspection recipes from the 2-D coordinate system;

wherein the SEM column control device irradiates the charged particle beam according to the electron optical system by outputting a control signal to every part of the electron optical system through a D/A converter, the sample which was placed on the stage, and an observation condition of the inspection recipe, wherein the SEM column control device moves the stage by the stage controller according to the wafer map and the defect file, and the SEM column control device scans the charged particle beam on an area which includes the defect sites of the sample, and the detector detects secondary electrons of the sample; and wherein the SEM column control device acquires a detection signal through an A/D converter, and generates SEM image data by executing image analysis processing and stores the data in a image memory section of the memory means.

7. A charged particle apparatus according to claim 6, wherein the coordinate system is a 2-D coordinate system which is specified by the vertical axis and a horizontal axis.

* * * * *